United States Patent [19]

Wolfe

[11] 3,821,045

[45] June 28, 1974

[54] MULTILAYER SILICON WAFER PRODUCTION METHODS

[75] Inventor: George Wolfe, Costa Mesa, Calif.

[73] Assignee: Hughes Aircraft Company, Culver City, Calif.

[22] Filed: July 17, 1972

[21] Appl. No.: 272,706

[52] U.S. Cl........................... 156/3, 156/8, 156/11, 156/17

[51] Int. Cl........................................... G23f 1/02

[58] Field of Search........ 156/3, 8, 11, 17; 317/234, 317/235

[56] References Cited

UNITED STATES PATENTS 3,551,196 12/1970 Herczog et al.................... 156/17 X

*Primary Examiner*—William A. Powell

*Attorney, Agent, or Firm*—W. H. MacAllister, Jr. and Lewis B. Sternfels

[57] ABSTRACT

One of three process sequences are used depending upon the desired end result. The first sequence represents a method for fabricating prototype, pilot line or proof of design system function. The second and third sequences are primarily directed at larger production quantities. These latter two sequences both incorporate processing where individual wafer identity is deferred to a later process step. This result is accomplished by altering the process sequence in order to place a 100 percent electrical testing and corresponding yield mapping operation at a point closer to the final process step. They differ in the manner in which pad relocation and signal routing metallization layers are formed. The second process sequence employes a metallization evaporation operation followed by a direct photoresist masking and etching operation, whereas the third sequence employs a reverse masking technique to form metallization layers. The present invention relates to methods for economical batch production of complex system functions on a whole or partial semiconductor wafer.

3 Claims, No Drawings

MULTILAYER SILICON WAFER PRODUCTION METHODS

BACKGROUND OF THE INVENTION

1. Field of the Invention

The present invention relates to methods for economical batch production of complex system functions on a whole or partial semiconductor wafer.

2. Description of the Prior Art

Successful conventional methods for processing wafers with complex system functions thereon have required separate handling of each wafer by producing a wafer with electronic components therein, dicing or cutting it up into individual pieces and assemblage of the components on the dices into functional networks or systems. The disadvantages of such processing are evidenced primarily in poor reliability of the system due to individual handling of each diced wafer. Further, the prior art techniques necessitate many additional packages with relatively large area, thereby decreasing performance and characteristics and increasing weight of the finished article. Performance characteristics are degraded because separate devices require interconnections therebetween and the distance of these interconnections between components provides increased capacitance, inductance and resistance, thus decreasing the speed at which such devices electrically act.

SUMMARY OF THE INVENTION

The present invention overcomes these and other problems by conducting all processing on the same wafer by multilayer techniques. This single wafer processing results in several advantages. First, smaller areas are dealt with, thus providing less weight of device, better electrical performance because of reduced number and length of interconnects, and improved thermal characteristics. Second, a single wafer requires less handling to provide better reliability at a lower cost. Third, fewer part types are required in the system to provide better maintenance and repair and replacement, as needed.

DESCRIPTION OF THE PREFERRED EMBODIMENTS

In the practice of the present invention, three process sequences have proved themselves to be most efficacious, depending upon the desired end result. The first sequence represents a method for fabricating prototype, pilot line or proof of design system function and the second and third sequences are primarily directed at larger production quantities. These latter two sequences both incorporate processing where individual wafer identity is deferred to a later process step. This result is accomplished by altering the process sequence in order to place a 100 percent electrical testing and corresponding yield mapping operation at a point closer to the final process step. They differ in the manner in which pad relocation and signal routing metallization layers are formed. The second process sequence employs a metallization evaporation operation followed by a direct photoresist masking and etching operation, whereas the third sequence employs a reverse masking technique to form metallization layers.

Specifically, the full or partial wafers, fabricated by the process sequences, comprise integrated circuits such as of the small scale integrated circuit (SSI) and medium scale integrated circuit (MSI) types forming intraconnect by three layers of metallization. Connections between different metallization layers are designated as vias. The three metallization layers are designated as (1) an internal intraconnect to form basic cells of the SSI or MSI type, (2) a pad relocation intraconnect metallization layer which is selected with respect to a specific yield map for a single wafer or multiple wafer, and (3) a single routing layer which performs the primary function of intraconnecting cells to form a specific logic function.

For all three processing sequences, a monolithic integrated logic function circuit is formed which includes cells and electrical contact points on the surface of a semi-conductor wafer. The techniques for producing monolithic integrated logic function circuits on a wafer of suitable semi-conductive material, such as silicon, are well known in the art as, for example, set forth in "Integrated Circuits, Design Principles and Fabrication," Raymond M. Warner, Jr. and James N. Fordemwalt, editors, MOTOROLA SERIES IN SOLID-STATE ELECTRONICS, McGraw-Hill Book Co., 1965, Chapters 5 and 12, in particular. As a result of this processing, the wafer is provided with a plurality of cells and a first metallization layer.

For example, the cells and the first metallization layer may be obtained by means of the following sequence steps. First, a wafer of P-type starting material of semiconductor quality is procured, either by fabrication or from a manufacturer. Second, the wafer is oxidized to provide an insulating layer over the wafer surface of, for example, silicon dioxide. Third, the silicon dioxide layer is selectively masked. Fourth, the wafer with the masked silicon dioxide layer is subjected to a buried layer pocket diffusion process to place a doped region deep within the wafer. Fifth, an N-type epitaxial layer is formed on the wafer. Sixth, the wafer is selectively masked with an isolation layer and doped further by a diffusion process. Seventh, the resistor and base portions are processed into the wafer by selective resistor and base masking processes and diffusion processes. Eighth, the emitter and N+ dopants are placed in the wafer by selective emitter and N+ masking and diffusion process steps. Ninth, gold is diffused in a nonselective manner from the back side of the wafer. Tenth, contacts are opened in the oxide layer on the surface of the wafer by selective silicon dioxide masking. Eleventh, ohmic contacts are provided, for example, of aluminum by an alloy-sintering operation. Finally, and twelfth, the aluminum layer is selectively masked and etched to form the basic logic cell of the SSI or MSI type. These steps are tabulated in Table I below:

TABLE I

| Sequence (1) | Sequence (2) | Sequence (3) |
|---|---|---|
| 1. P-Type Starting Material | Same | Same |
| 2. Wafer Oxidation | Same | Same |
| 3. Selective $SiO_2$ Masking | Same | Same |
| 4. Buried Layer Pocket Diffusion | Same | Same |
| 5. N-type Epitaxial Growth | Same | Same |
| 6. Selective Isolation Masking & Diffusion | Same | Same |
| 7. Selective Resistor & Base Masking & Diffusion | Same | Same |
| 8. Selective Emitter & N+ Masking & Diffusion | Same | Same |

TABLE I-Continued

| Sequence (1) | Sequence (2) | Sequence (3) |
|---|---|---|
| 9. Gold Diffusion — Non-Selective | Same | Same |
| 10. Selective $SiO_2$ Masking — Open Contacts[2] | Same | Same |
| 11. Ohmic Contact, Alloy-Sintering Operation | Same | Same |
| 12. Selective Masking & Etching of Al to form basic logic cell of SSI or MSI type | Same | Same |

Following production of the basic logic cell and the wafer, the completed wafer with a complex system function is produced by one of the three process sequences given below:

U.S. Pat. application Ser. No. 17,399 now U.S. Pat. No. 3,700,510 patented Oct. 24, 1972 entitled "Masking Techniques for Use in Fabricating Microelectronic Components and Articles Producible Thereby" by Carl E. Keene and Ruth D. Bradley, and assigned to the assignee of the present application.

Following formation of the glass film with first vias therein, aluminum metallization in a specific interconnect configuration is laid down as defined in steps 21 and 22. In sequences (1) and (2), an aluminum layer is deposited over the glass layer with the first vias therein and then masked and etched to produce the desired interconnect configuration. The difference between sequences (1) and (2) is that the mask utilized is a pad relocation mask for the former sequence and a signal routing mask for the latter. Such pad relocation may be performed as taught in copending U.S. Pat. application Ser. No. 206,555 filed Dec. 9, 1971, now U.S. Pat. No. 3,795,972 issued Mar. 12, 1974, by Donald F. Calhoun entitled "Integrated Circuit Interconnections By Pad Relocation" and assigned to the assignee of the present application. In sequence (3), the aluminum interconnect configuration is formed by a reverse masking process, such as by the method described in copending patent application entitled "Bimetal Mask for Multilayer Interconnection Fabrication in Microelectronics" U.S. Pat. Ser. No. 272,519 filed July 17, 1972, by Carl E. Keene and George Wolfe, and assigned to the assigness of this application or by Allen G. Baker in "Low Pressure Sputtering and the Overhanging Lift" which is a permanent record of the papers presented at the "Second Symposium on the Deposition of Thin Films by Sputtering" on June 6 and 7, 1967, at the University of Rochester. These steps of sequence (3) are defined in steps 18–22*b'* in which a layer of magnesium is first deposited, on the glass layer with vias therein, and then a layer of aluminum is deposited on the magnesium layer,. The aluminum is etched in conjunction with a photoresist mask by an etchant which does not significantly affect magnesium and then the magnesium is etched, utilizing the aluminum as a mask, by an etchant which does not significantly affect the aluminum to

TABLE II

| | Sequence (1) | | Sequence (2) | | Sequence (3) |
|---|---|---|---|---|---|
| 13. | 100% Electrical Cell Testing and Mapping of Wafer | | | | |
| 14. | Mg. Al Deposition | 14. | Mg. Al Deposition | 14. | Mg. Al Deposition |
| 15. | Mushroom Formation | 15. | Mushroom Formation | 15. | Mushroom Formation |
| 16. | Sputtered (Deposit) Glass, 1st Via | 16. | Sputtered (Deposit) Glass 1st Via | 16. | Sputtered (Deposit) Glass 1st Via |
| 17. | Mushroom Float Out | 17. | Mushroom Float Out | 17. | Mushroom Float Out |
| | | | | 18. | Mg. - Al Deposition |
| | | | | 19*b*. | Reverse Masking; Al Etch |
| | | | | 20*c*. | Controlled Mg Etching and Undercutting |
| 21. | Al Deposition | 21. | Al Deposition | 21. | Al Deposition |
| 22*a*. | Mask & Etch Pad Relocating Metallization Layer | 22*b*. | Mask & Etch Signal Routing Metallization Layer | 22*b'*. | Selective Removal of Mg to form Signal Routing Metallization Layer |
| | | 23. | 100% Electrical Cell Testing and Mapping of Wafer | 23. | 100% Electrical Testing and Mapping of Wafer |
| 24. | Mg. Al Deposition | 24. | Mg. Al Deposition | 24. | Mg. Al Deposition |
| 25. | Mushroom Formation | 25. | Mushroom Formation | 25. | Mushroom Formation |
| 26. | Sputter (Deposit) Glass 2nd Via | 26. | Sputter (Deposit) Glass 2nd Via | 26. | Sputter (Deposit) Glass 2nd Via |
| 27. | Mushroom Float Out | 27. | Mushroom Float Out | 27. | Mushroom Float Out |
| 28. | Al Deposition | 28. | Al Deposition | 28. | Al Deposition |
| 29*a*. | Mask & Etch Signal Routing Metallization Layer | 29*b*. | Mask & Etch Pad Relocation Metallization Layer | 29*b*. | Mask and Etch Pad Relocation Metallization Layer |

All three sequences (1), (2) and (3) define a plurality of process steps including two further metallization layers as shown in steps 21 and 28. In sequence (1), step 13 comprises a 100 percent electrical cell testing and mapping of the wafer by a conventional prober and tester. This step 13 of sequence (1) is conducted in sequences (2) and (3) but at a later time, occurring at step 23 after the first metallization layer has been deposited and etched to produce a signal routing metallization layer.

In all three sequences, whether or not 100 percent electrical cell testing and mapping has been conducted, an isolating glass film is deposited as defined in steps 14–17. These four steps comprise a method of forming a glass layer with tapered holes therein by use of a magnesium-aluminum mask having a mushroom-shaped figuration, magnesium forming a pedestal and the aluminum forming an overhanging crown. When glass is sputter deposited over a wafer having such a mushroom-shaped mask placed at selected points, the glass deposits over the wafer and on the crown of the mushroom and also at the base of the mushroom in a tapered manner. The mushroom-shaped mask is then removed to leave tapered openings or vias in the glass film. Such a method is more completely described in copending cut away magnesium underlying the aluminum. The result is a magnesium-aluminum mask having openings therein which define the interconnection routing. The aluminum layer, as set forth in step 21, is then deposited over the unmasked glass film with first vias therein and over the magnesium-aluminum mask. In step 22 *b'*, the magnesium-aluminum mask is removed, leaving behind a metallization layer in the desired circuit interconnection.

In sequences (2) and (3), in step 23, 100 percent electrical cell testing and mapping is conducted, this testing and mapping for sequence (1) having been undertaken at an earlier stage.

Thereafter, in all three sequences, a glass film with second vias therein is placed over the wafer and aluminum layer having the specific interconnect, as described in process steps 24–27, these steps being the same as described above in steps 14–17 and utilizing the process described in copending U.S. Pat. application Ser. No. 17,399 (U.S. Pat. No. 3,700,510).

An aluminum layer is then deposited over the glass layer with the second vias therein as set forth in step 28. The final step, step 29, comprises masking and etching of specific interconnects, the difference between sequence (1) and sequences (2) and (3) being the type of mask utilized. In the first sequence, the mask defines a signal routing interconnect (step 29*a*), while in the latter two sequences the mask defines relocation of the pads (step 29*b*).

The advantages of sequence (1) is for pilot or prototype devices and provides access to the majority of multilayer signal routing interconnects. It affords the largest capability of making changes or corrections.

As can be seen from a comparison of the two sequences in Table II, the differences between sequences (1) and (2) is that the 100 percent testing and mapping step is moved to a point after the second metallization has been placed on the wafer and that the pad relocation and signal routing mappings are exchanged. The result of these two changes is as follows. In sequence (2) the yield loss suffered between steps 14 and 22 is detectable by the 100 percent test and mapping of step 23 and then correctable by the pad relocation mask of step 29*b*. Thus, a wafer having some nonfunctioning cells or circuits due to multilayer processing after step 13 need not be discarded. It thereby provides a higher yield of good wafers. In sequence (2) the identity of the wafer regarding the mask can be held off to a later point in the processing. Also, if a larger percentage of circuits turn out to be nonfunctioning, it is possible to dispose of the wafer. For example, if discontinuities, such as pin holes, exist in the insulative layer, the etching of the second metallization is more likely to damage the first level metallization through the pin holes than in subsequent etching operations. This damage is more likely to occur because the first metallization is thinner, narrower and denser than subsequent layers of metallization. For example, a first metallization is typically 0.4 mils wide and 1 micron thick while the second metallization is a minimum of 2.0 mils wide and 2 microns thick. The density of the first metallization lines are usually at least twice that of the second metallization lines.

Sequence (3) differs from sequence (2) by the addition of steps 18–22*b* to obtain the same end result of signal routing. The advantages of the sequence is to provide a sloping of the metal interconnects which provide a greater reliability in multilayer processing, as disclosed in above-referenced copending U.S. Pat. application Ser. No. 272,519 filed July 17, 1972. Also, since the etchant for magnesium does not effect aluminum to a significant degree, if a pin hole should exist in the glass layer, the underlying aluminum is not effected, thus resulting in the likelihood of undamaged wafer elements.

Furthermore, the problem of pin holes in vastly different among the three sequences. In sequence (1), testing might destroy a component underlying a pin hole but the processor would never know of such destruction, at least at this point. In sequence (2), processing might destroy the underlying components after the 100 percent test but the operator would know of this malfunction and could correct it by a relocation process of masking to utilize another unused but functioning cell. In sequence (3) processing would not destroy the underlying component because the use of the magnesium etch rather than an aluminum etch would not destroy the underlying aluminum. Thus, sequence (3) results in a higher yield of usable cells.

Although the invention has been described with reference to particular embodiments thereof, it should be realized that various changes and modifications may be made therein without departing from the spirit and scope of the invention.

What is claimed is:

1. A method for batch production of complex system functions on whole and partial semiconductor wafers comprising the steps of:

forming monolithic integrated logic function circuits including cells and electrical contact points on a surface of the wafer;

electrically testing and mapping each circuit cell to determine the location of properly functioning cells;

forming an insulative layer over the wafer surface by sputter deposition of a glass layer with via means extending through the glass layer to at least the properly functioning cells;

depositing an aluminum layer over the glass layer and through the via means;

masking and etching portions of the aluminum layer with a pad relocation mask to select pads electrically coupled to the contact points of the properly functioning cells;

isolating all portions of the etched aluminum layer by sputter deposition of a second glass layer with second via means extending through the second glass layer to the etched aluminum layer to provide selected points of electrical interconnect;

depositing a second aluminum layer over the second glass layer and the selected points of electrical interconnect through the second via means; and masking and etching the second aluminum layer with a signal routing mask to provide a signal routing circuit configured in the complex system functions.

2. A method for batch production of complex system functions on whole and partial semiconductor wafers comprising the steps of:

forming monolithic integrated logic function circuits including cells and electrical contact points on a surface of the wafer;

forming an insulative layer over the wafer surface by sputter deposition of a glass layer over the surface with via means extending through the glass layer to at least the cells to be used;

depositing an aluminum layer over the glass layer and through the via means;

masking and etching portions of the aluminum layer with a signal routing mask to produce a preliminary signal routing circuit configured in the complex system functions;

electrically testing and mapping the cells to determine the location of properly functioning cells;

forming a further insulative layer over the thus processed surface of the wafer by sputter deposition of a second glass layer with second via means extending through the second glass layer to at least the properly functioning cells;

depositing a second aluminum layer over the second glass layer and through the second via means;

masking and etching portions of the second aluminum layer with a pad relocation mask to produce selected pads electrically coupled to the properly functioning cells and circuits configured in the complex system functions.

3. A method for batch production of complex system functions on whole and partial semiconductor wafers comprising the steps of:

forming monolithic integrated logic function circuits including cells and electrical contact points on a surface of the wafer;

forming an insulative layer over the wafer surface by sputter deposition of a glass layer with via means extending through the glass layer to at least the cells to be used;

depositing a mask over portions of the glass layer and the via means to define uncovered paths of circuit interconnections configured in at least a portion of the complex system functions, the mask comprising a magnesium pedestal and an aluminum cover overhanging the magnesium pedestal;

depositing an aluminum layer over the magnesium-aluminum mask and the glass layer and through the via means to provide the paths of the circuit interconnections;

removing the magnesium-aluminum mask;

electrically testing and mapping the cells to determine the location of properly functioning cells;

forming a further insulative layer over the thus processed wafer surface by sputter deposition of a second glass layer over the circuit interconnections with second via means extending through the second glass layer and to at least the properly functioning cells;

depositing a second aluminum layer over the second glass layer and through the second via means;

masking and etching portions of the second aluminum layer with a pad relocation mask to produce selected pads electrically coupled to the properly functioning cells and circuits configured in the complex system functions.

* * * * *